April 28, 1970 S. A. IDZIK, JR., ET AL 3,508,324
METHOD OF MAKING CONTACTS TO SEMICONDUCTOR DEVICES
Filed Feb. 13, 1967
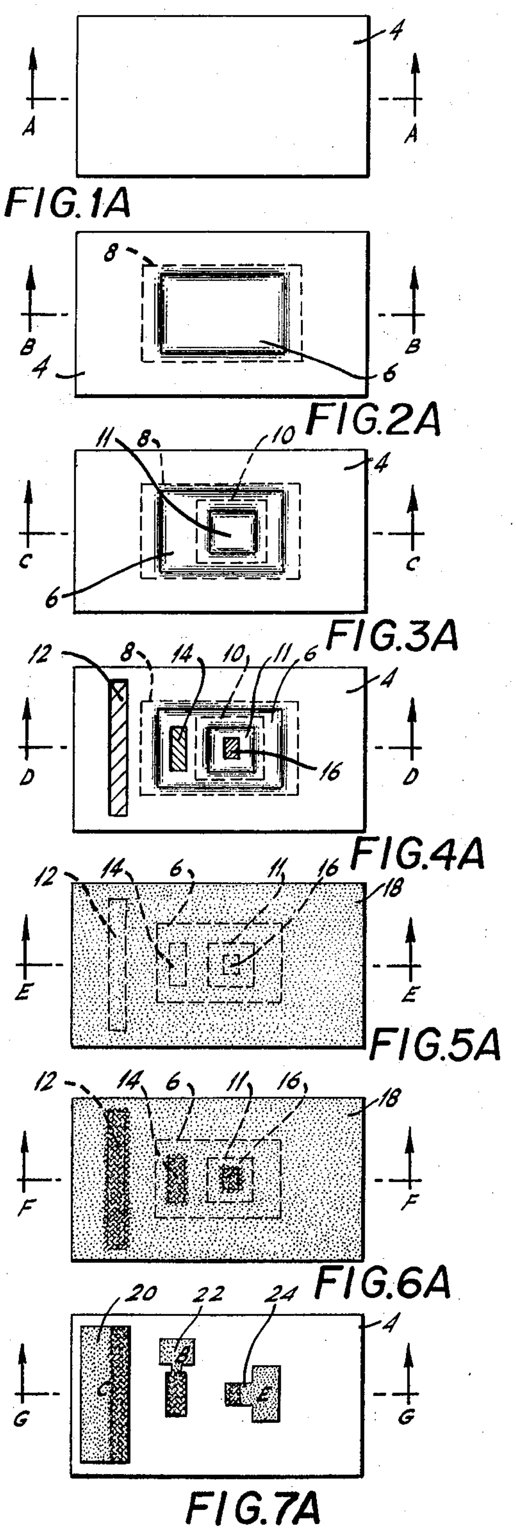
FIG.1A, FIG.2A, FIG.3A, FIG.4A, FIG.5A, FIG.6A
FIG.7A
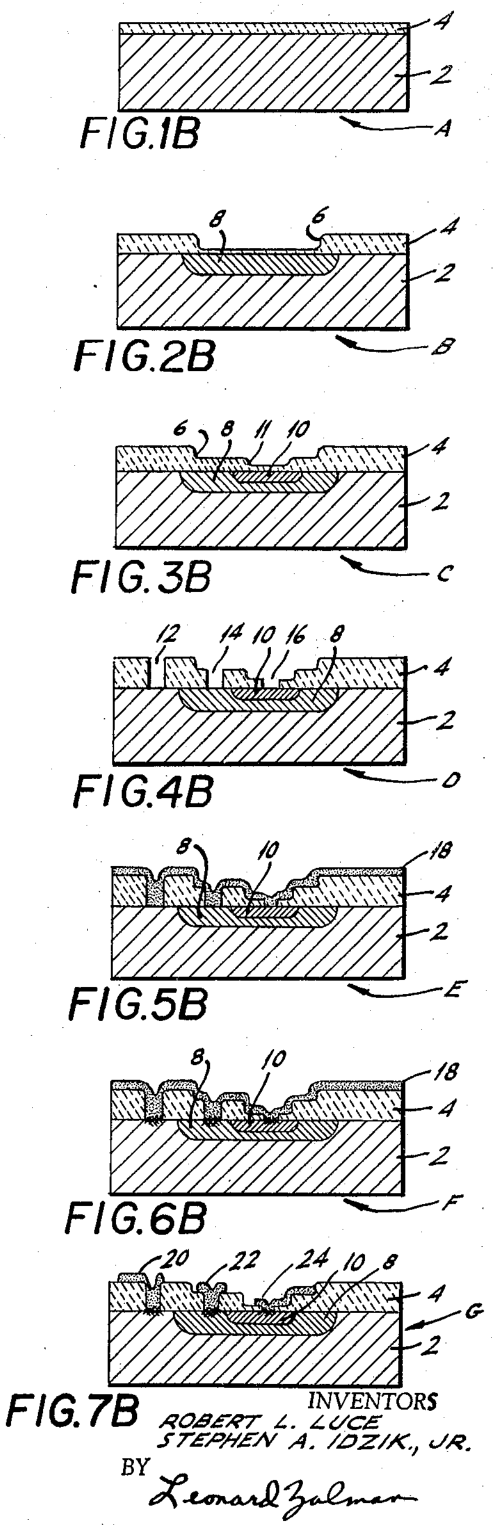
FIG.1B, FIG.2B, FIG.3B, FIG.4B, FIG.5B, FIG.6B
FIG.7B
INVENTORS
ROBERT L. LUCE
STEPHEN A. IDZIK., JR.
BY Leonard Zalman
ATTORNEY United States Patent Office 3,508,324
Patented Apr. 28, 1970

3,508,324
METHOD OF MAKING CONTACTS TO SEMICONDUCTOR DEVICES

Stephen A. Idzik, Jr., Philadelphia, and Robert L. Luce, North Wales, Pa., assignors to Philco-Ford Corporation, Philadelphia, Pa., a corporation of Delaware Filed Feb. 13, 1967, Ser. No. 615,404
Int. Cl. H01l 7/02
U.S. Cl. 29—589 2 Claims

ABSTRACT OF THE DISCLOSURE

A method of producing ohmic contacts to a semiconductor crystal in which a film of the aluminum is sintered at a temperature below 550° centigrade to the semiconductor crystal prior to delineation of the film.

In the fabrication of silicon microcircuits, transistors, and other devices having surface regions of different conductivity types, it is desirable to use the same metal for making ohmic contacts to the surface regions of both conductivity types. Since aluminum is a suitable and very widely used contact metal for silicon, the invention will be described with particular reference thereto. However, the use of aluminum as the contact metal is only illustrative and other suitable contact metals, such as platinum, may be used instead.

Typically, the structure on which the contacts are to be formed comprises a wafer of silicon having impurity regions formed therein by diffusion or other suitable means. Generally the surface of the wafer is covered with a protective oxide layer in which openings have been formed coincident with selected portions of the impurity regions. A relatively thin, undesirable oxide film may exist even over the presumably exposed regions of the surface.

Typically, aluminum contacts are made by a process which comprises the steps of coating with a thin film of aluminum the oxide coated surface of the wafer including the regions to which contacts are to be made, removing selected portions of the aluminum film to produce the desired pattern (hereinafter referred to as delineating) and subsequently bonding the remaining aluminum to the silicon regions exposed by the openings in the protective oxide layer to produce electrical and mechanical connections therebetween. It is necessary to bond the aluminum to the silicon because, as noted above, during the processing of the silicon there is a tendency for a thin undesirable insulating oxide film to form on the silicon surface. Due to this oxide film, the aluminum film as originally formed, e.g. by vapor deposition, is merely lying on the surface of this thin oxide film, in close physical proximity to the silicon surface but not physically or electrically bonded thereto.

In order to produce ohmic contacts that have good electrical and mechanical characteristics, it is necessary to heat the aluminum-oxide interface to a temperature at which the aluminum will react with and penetrate the undesirable oxide film. Likewise, the temperature at the interface between the aluminum which has penetrated the undesirable oxide and the silicon (the aluminum-silicon interface) must be heated sufficiently to produce a bond between the aluminum and the silicon. It was originally thought that a good bond between aluminum and silicon could be achieved only if the aluminum-silicon interface was heated to and maintained at a temperature in excess of the aluminum-silicon eutectic temperature, 577° C. However, at temperatures above the aluminum-silicon eutectic, aluminum tends to form unwanted rectifying contacts rather than ohmic contacts with N-type conductivity silicon. The formation of these unwanted rectifying contacts is believed to be the result of a liquid aluminum-silicon layer which is formed when the bonding temperature exceeds the aluminum-silicon eutectic. Upon cooling, this layer recrystallizes upon the silicon and often forms a continuous P-type conductivity layer between the silicon and the bonded contact. If the underlying silicon is of P-type conductivity there is no problem, and a good ohmic contact is produced through the recrystallized layer. However, if the underlying silicon is of N-type conductivity and if the recrystallized P-type conductivity layer is large enough to cover the entire aluminum-silicon interface, unwanted rectifying junctions are formed between this P-type and N-type silicon and hence between the aluminum contacts and the underlying N-type silicon rather than the desired ohmic contacts.

It has been discovered recently that good ohmic contacts can be produced between a previously delineated aluminum surface coating and a silicon region of either conductivity type by heating and maintaining the aluminum-silicon interface at a temperature which is desirably just below the aluminum-silicon eutectic. At this temperature, which must be between 550° C. and 575° C., a solid-solid reaction (sintering) occurs along the aluminum-silicon interface. Since this reaction occurs at temperatures below the aluminum-silicon eutectic, formation of the previously mentioned aluminum-silicon liquid layer is eliminated or confined to small, isolated areas of the interface. As a result, unwanted rectifying contacts are not produced.

Although the discovery that a previously delineated aluminum film can be bonded to silicon by sintering makes it possible to form ohmic contacts between aluminum and silicon regions of both conductivity types, several problems arise in the application of this discovery. By delineating the aluminum film prior to sintering the aluminum to the silicon, the area of the silicon diffusion sink surrounding each aluminum-silicon interface may be different, depending upon the desired contact interconnection pattern. Since, as will be explained in more detail presently, the size of the silicon diffusion sink surrounding an aluminum-silicon interface is a factor determining the extent of the aluminum-silicon reactions at the interface, delineating the aluminum film prior to sintering may cause the extent of the aluminum-silicon reactions at one aluminum-silicon interface to be different from the extent of the aluminum-silicon reactions at another aluminum-silicon interface. Therefore, for a given sintering temperature and time, the extent of the reactions at one aluminum-silicon interface may be sufficient to produce a good ohmic contact whereas the extent of the reactions at another aluminum-silicon interface may be insufficient to produce a good ohmic contact and an "open" contact may result. Alternatively, if the sintering temperature is sufficient to produce a good contact at the latter interface, this sintering temperature may produce such extensive reactions at the former interface that the aluminum may penetrate a rectifying junction adjacent this interface and a "short" of this junction may result. Furthermore, the ohmic contacts that are produced by this process are generally brittle and have high internal resistances.

A particularly difficult problem arises in the formation of contacts to very thin, localized regions of a semiconductor device, e.g. 0.5 mil wide and 1.5 microns deep, since slight lateral or normal penetration of the silicon wafer by the aluminum may result in the shorting of the rectifying junctions associated with these thin, localized regions. Accordingly, the reactions at the aluminum-silicon interface of a very thin, localized region must be carefully controlled so that a bond between the aluminum and the region will be formed without aluminum penetration of the region.

Another drawback of the sintering process is that aluminum reacts with the protective oxide film that normally insulates the aluminum from portions of the silicon. The rate of this reaction is a direct function of temperature. At the required sintering temperature (550° C. to 575° C.), this reaction is relatively rapid and can result in penetration of the protective oxide film by the aluminum and hence the shunting or shorting of a rectifying junction.

It is therefore an object of the present invention to provide an improved process of fabricating semiconductor devices.

It is a further object of the present invention to provide an improved process for producing ohmic contacts to silicon that have good electrical and mechanical characteristics.

It is a still further object of the present invention to provide an improved process for simultaneously producing ohmic contacts that have good electrical and mechanical characteristics of regions of a semiconductor surface.

It is an additional object of the present invention to provide an improved process of producing ohmic contacts between aluminum and silicon regions of both conductivity types.

According to one aspect of the present invention, ohmic contacts are produced between a contact metal and a silicon region of either conductivity types by increasing the size of the silicon diffusion sink surrounding the contact metal-silicon interface. Preferably, a substantially uniform border of the contact metal is provided around the contact metal-silicon interface during sintering. The border is subsequently delinated to form the desired contact. Using this improved process, sintering can be achieved between aluminum and silicon at temperatures substantially below the aluminum-silicon eutictic temperature, e.g. 475° C. for 15 minutes.

According to another aspect of the present invention, ohmic contacts having good electrical characteristics can be made simultaneously to a plurality of silicon surface regions of one or both conductivity types by making the silicon diffusion sink surrounding each contact metal-silicon interface substantially similar. Preferably, this may be achieved by forming a substantially continuous film of the contact metal over said regions and over a substantial portion of the surface adjacent said regions, heating said metal and said surface to a temperature which is sufficient to cause sintering therebetween, and subsequently delineating said film to produce the desired contacts and contacts and contact interconnection pattern.

For a better understanding of the present invention together with other and further objects thereof reference should now be had to the following detailed description which is to be read in conjunction with the accompanying drawings in which FIGURES 1A and 1B through FIGURES 7A and 7B are plan and sectional views of a semiconductor device at separate stages of the manufacture thereof in accordance with the present invention.

Although the solid-solid reaction that occurs at the interface between the contact metal and the silicon during sintering is not fully understood, it is believed that the quality of the ohmic contacts made to a semiconductor wafer depends upon (1) the density of the contact metal-semiconductor interaction sites at a contact metal-semiconductor interface and (2) the extent of the reaction at each interaction site. We hypothesize that the rate at which interaction sites are established is an inverse function of the amount of semiconductor material that is dissolved in a unit volume of the contact metal. We also hypothesize that the extent of the reaction at each interaction site is a direct function of (1) the sintering temperature, and (2) the amount of contact metal which serves as a sink for the diffusion of the semiconductor material. Although the advantages of the method of the present invention will be explained in reference to the foregoing hypotheses, it is not our intention to limit our invention by this explanation.

By increasing the size of the silicon diffusion sink, the content of diffused silicon per unit volume of contact metal is reduced. In accordance with the foregoing hypotheses, a decrease in the amount of silicon per unit volume of contact metal increases the density of contact metal-silicon interaction sites within a given contact metal-silicon interface. Because of this increases, ohmic contacts are produced which have lower internal resistance (more contact points) than ohmic contacts produced by prior art processes.

Since, in accordance with the foregoing hypothese, the extent of the reaction at each interaction site is a direct function of both the sintering temperature and the size of the silicon diffusion sink, increasing the size of the silicon diffusion sink makes it possible to produce contact metal-silicon reactions at lower temperatures. In the specific case of aluminum, substantial reactions can be produced at temperatures as low as 390° C. Since any aluminum-silicon reactions at these low temperatures must be of a solid-solid nature, no intervening recrystallized layer is possible and ohmic contacts are produced between the silicon and the aluminum.

Due to the limited extent of aluminum-silicon reactions at temperatures substantially below the aluminum-silicon eutectic, there is only slight lateral or normal penetration of the silicon by the aluminum. According, increasing the size of the silicon diffusion sink surrounding thin and/or narrow isolated regions increases the probability that a bond will be formed with these regions without aluminum penetration of the junctions associated with these regions.

The low range of sintering temperatures achievable with an increased silicon diffusion sink also reduces the extent of the reaction between the contact metal and any oxide films that have formed on the surface of the silicon. When aluminum is used as the contact metal, the extent of the aluminum-silicon oxide reaction at temperatures substantially below the aluminum-silicon eutectic is sufficient to produce penetration of the relatively thin, undesirable oxide film that is formed unavoidably on the silicon during processing but the reaction is generally not sufficient to cause penetration of thicker protective oxide films, such as those purposely formed to insulate the silicon from the aluminum. Accordingly, conductive paths through the latter oxide film are substantially eliminated.

In addition to the foregoing advantages, the previously mentioned problem of "shorts" and "opens" is substantially eliminated by the process of the present invention. By not delineating the contact metal film prior to sintering, the silicon diffusion sink at each contact metal-silicon interface is substantially similar. Since the extent of the reactions at each interaction site within an interface is dependent upon the size of the diffusion sink surrounding that interface, similar diffusion sinks will produce reactions of similar extent at the interaction sites of each interface. Due to this latter similarity, contacts having substantially the same electrical characteristics are produced simultaneously at each contact metal-silicon interface.

Furthermore, since the large diffusion sink reduces the amount of silicon per unit volume of contact metal, the amount of silicon within any interconnection strip of the delineated contact metal is reduced. This increases the reliability of the interconnection strips because silicon diffused in aluminum, for example, causes increased film resistivity and embrittlement which under high stress operating conditions can lead to device or interconnection failures.

For a better understanding of the present invention the fabrication of a typical silicon transistor having aluminum contacts will be described in conjunction with the accompanying drawings. As shown in FIGS. 1A and 1B, after cleaning and lapping, a surface of an N-type silicon wafer 2 is oxidized to form a silicon oxide film 4. This film may be produced by inserting the wafer into a furnace maintained at approximately 1200° C. and passing 100 cc./minute of dry oxygen through the furnace. Next, as shown in FIGS. 2A and 2B, the oxide film 4 is formed into a mask by making an opening 6 therethrough. The opening 6 may be made by any conventional photoengraving process, such as that described in U.S. Patent No. 3,108,-359, to Moore et al.

As a further step in the production of the device, an acceptor impurity is diffused into wafer 2 through opening 6 to produce a P-type region 8 in the wafer 2. During the diffusion of the impurity into the wafer 2, an oxide of silicon is formed so that, as indicated in FIGS. 2A and 2B, an oxide layer covers the entire wafer surface. In a similar manner, as shown in FIGS. 3A and 3B, an N-type region 10 is formed in region 8 by diffusing a donor impurity through an opening 11 in the latter oxide layer.

After portions of the oxide film are removed to expose a contact area for each region, indicated by reference numbers 12, 14, and 16 in FIGS. 4A and 4B, the entire surface of the wafer 2 is coated with a film of pure aluminum 18, as shown in FIGS. 5A and 5B. The aluminum film may be formed by vacuum coating in a standard, bell-jar evaporator.

The aluminum film is then sintered to the contact areas (indicated by the crosshatching in FIGS. 6A and 6B) by inserting the wafer into a furnace maintained at a temperature substantially below the aluminum-silicon eutectic temperature, e.g. 475° C., for a brief period of time, e.g. 15 minutes. The wafer is then withdrawn to a cool part of the furnace and subsequently cooled to room temperature.

Unwanted portions of the aluminum film are now removed, as shown in FIGS. 7A and 7B, to form the desired collector, base, and emitter contacts 20, 22 and 24, respectively. The process used for removing portion of the oxide film may be used to remove the unwanted portions of the aluminum film using different masks and etching solutions. The fabrication of the device is then completed in the conventional manner.

While the invention has been described with reference to a particular embodiment thereof, it will be apparent that various modifications and other embodiments thereof will occur to those skilled in the art within the scope of the invention. Accordingly, we desire the scope of our invention to be limited only by the appended claims.

We claim:

1. The process of simultaneously forming ohmic contacts between aluminum and regions of a surface of a silicon body, comprising the steps of:

coating the portions of said surface surrounding said regions with an oxide film, coating said oxide film and said regions with a film of aluminum, thereby to provide a large aluminum diffusion sink, sintering to said regions the respective portions of said aluminum film overlying said regions, the sintering temperature being less than about 550° centigrade, and subsequently delineating said aluminum film to shape said contacts and to produce any desired interconnections between said contacts.

2. A process according to claim 1 wherein said sintering temperature is about 475° centigrade and the time duration of said sintering is about 15 minutes.

References Cited

UNITED STATES PATENTS

| | | | |
|---|---|---|---|
| 2,981,877 | 4/1961 | Noyce. | |
| 3,266,127 | 8/1966 | Hardin et al. | 29—590 X |
| 3,362,851 | 1/1968 | Dunster | 29—590 X |

OTHER REFERENCES

"Solid State Electronics," October 1965, pp. 831–833, article entitled "Electrical Contacts to Silicon."

IBM Tech. Disc. Bull., vol. 9, No. 6, November 1966, p. 719.

PAUL M. COHEN, Primary Examiner

U.S. Cl. X.R.

29—472.9, 504, 577, 590